United States Patent
Krause et al.

(10) Patent No.: US 6,459,649 B2
(45) Date of Patent: Oct. 1, 2002

(54) ADDRESS GENERATOR FOR GENERATING ADDRESSES FOR AN ON-CHIP TRIM CIRCUIT

(75) Inventors: Gunnar Krause, München (DE); Wolfgang Spirkl, Germering (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/854,258

(22) Filed: May 10, 2001

(30) Foreign Application Priority Data

May 10, 2000 (DE) .......................... 100 22 767

(51) Int. Cl.$^7$ ................................ G11C 8/00
(52) U.S. Cl. .................. 365/230.08; 365/233
(58) Field of Search ............ 365/189.05, 189.07, 365/189.09, 200, 201, 225.7, 230.01, 230.08, 233, 236, 240

(56) References Cited

U.S. PATENT DOCUMENTS

| | | | |
|---|---|---|---|
| 5,886,940 A | * 3/1999 | Morzano et al. | 365/225.7 |
| 5,889,727 A | * 3/1999 | Hsu et al. | 365/233 |
| 5,892,719 A | * 4/1999 | Kanagawa | 365/200 |
| 5,933,370 A | * 8/1999 | Holzmann et al. | 365/225.7 |

* cited by examiner

*Primary Examiner*—Trong Phan
(74) *Attorney, Agent, or Firm*—Laurence A. Greenberg; Werner H. Stemer; Gregory L. Mayback

(57) ABSTRACT

An address generator for generating addresses for an on-chip trim circuit for tuning a reference voltage produced on a semiconductor chip. The address generator contains a particular number of stages, each made up of a memory latch, which, upon a control signal supplied to a control input of the address generator, and upon a clock signal applied to a clock input of the address generator, can optionally be operated as a synchronous counter or as a shift register. The number M being greater than or equal to 1.

9 Claims, 2 Drawing Sheets

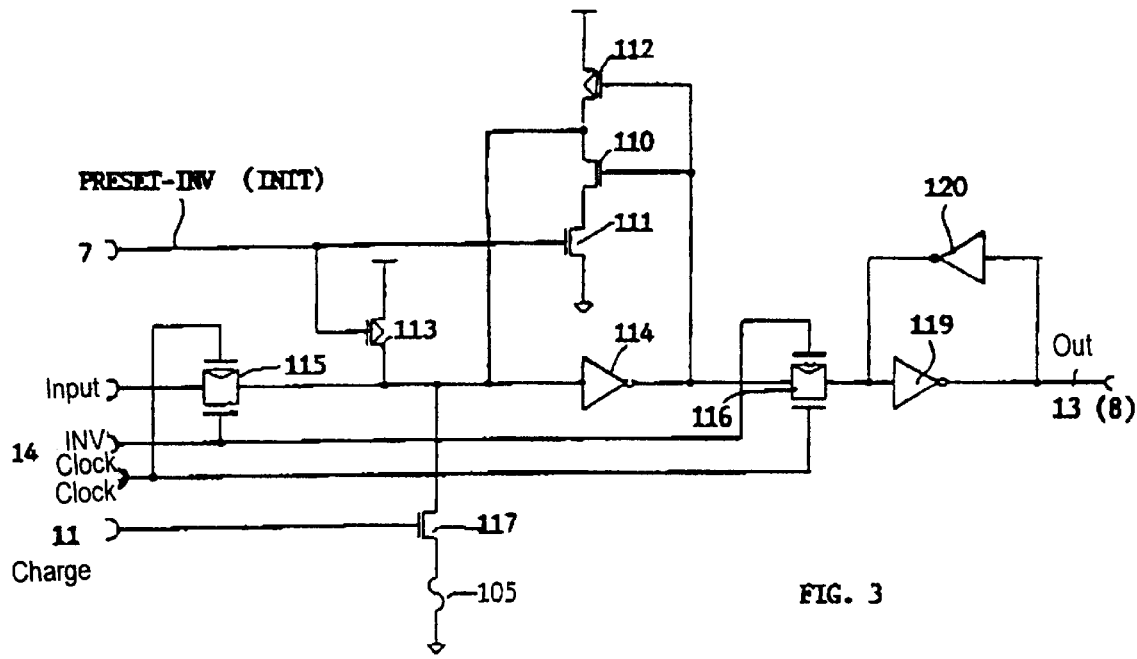
FIG. 3
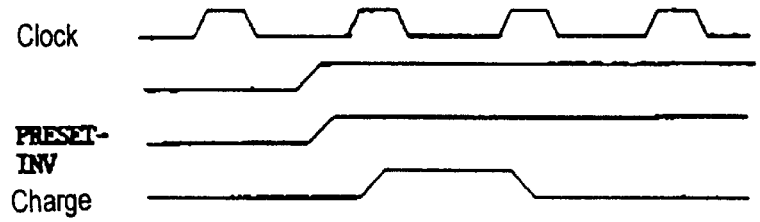
FIG. 4
| Fuse | Output 13 (8) |
| --- | --- |
| IN-TACT | 0 |
| Blown | 1 |
FIG. 5

ADDRESS GENERATOR FOR GENERATING ADDRESSES FOR AN ON-CHIP TRIM CIRCUIT

BACKGROUND OF THE INVENTION

Field of the Invention

The invention relates to an address generator for generating addresses for an on-chip trim circuit that is used to tune reference voltages produced on a semiconductor chip.

In particular in integrated memory modules, e.g. DRAMs, voltage generators located on the chip must be adjusted or trimmed, in their target voltage, which fluctuates due to manufacturing tolerances. For the calibration, it is known to use an address generator on the chip that is connected with a trim circuit and that counts through the possible calibration stages. Electrical "fuses" are connected with an address generator of this sort, in order to permanently store the addresses generated by the address generator for the trim circuit, given agreement of the respective changing or variable reference voltage with a comparison or reference supplied externally, in that a respective electrical fuse is shot or left intact corresponding to the finally valid address information.

In general, in highly integrated semiconductor circuits, such as e.g. a 256M SDRAM, it is necessary to keep the surface required by a functional unit on the semiconductor chip as small as possible, and to reduce the number of control lines.

SUMMARY OF THE INVENTION

It is accordingly an object of the invention to provide an address generator for generating addresses for an on-chip trim circuit which overcomes the above-mentioned disadvantages of the prior art devices of this general type, in which the surface required by it on the semiconductor chip is optimized, the number of control lines is reduced, and, moreover, a circuit configuration is achieved that is as flexible as possible and can be adapted to various functional demands.

With the foregoing and other objects in view there is provided, in accordance with the invention, an address generator for generating addresses for a trim circuit for tuning a reference voltage produced on a semiconductor chip. The address generator contains a control input for receiving a control signal, a clock input for receiving a clock signal, and a number of M stages having memory latches and connected to the clock input and to the control input. Upon the control signal being supplied to the control input and upon the clock signal being applied to the clock input, the number of M stages are able to be operated as a synchronous counter or a shift register, where M is greater than or equal to 1.

According to an essential aspect, the inventive address generator contains a particular number of stages, each made up of a memory latch. Here each latch is realized as an edge-controlled flip-flop, as used in synchronous counters. When a clock signal is supplied to a clock input, and a control signal is supplied, the address generator can optionally be operated as a counter or as a shift register. The number of stages is at least equal to 1.

The stages of the address generator each contain one of the previously mentioned electrical fuses. Each memory latch has MOS transistors, in order to match address information that is to be supplied to the electrical fuses to the CMOS level.

The memory latches have a common initialization input and a charge or load input, and are set up in such a way that a signal applied to the charge input brings the latch information into the value complementary to the initialization value only if the respective fuses are intact (or shot depending on the technology used).

In a preferred development, the address generator can be supplemented with the following further functions. The address generator can contain a serial input and a serial output for reading out a counter state or the fuse information. The address generator can additionally contain feedback elements that optionally couple the serial output back to the serial input. Through the feedback of the serial output to the serial input, the counter state or the fuse information can be read out non-destructively at the serial output. On the other hand, other information, e.g. test information, can be applied to the serial input and can be taken over into the address generator in clock-controlled fashion. In addition, a programming input can be provided at the address generator in order to program the fuses bit-by-bit with the information present in the memory latches. Moreover, a forwards-backwards selector input can be provided for the selection of the counting direction of the counter, or the shift direction of the shift register of the address generator. The shift register of the address generator can be expanded by an additional memory latch (1 bit), in which a current (YES/NO) comparison result of a voltage comparator can be stored that compares the voltage currently produced by the trim circuit with an external reference voltage. The comparison result stored in the additional memory element can then be emitted at the serial output together with the generated address value.

Advantageously, the inventive address generator optimizes the required surface on the semiconductor chip and reduces the number of control lines. In particular, the number of output lines to an external test device is lowered to 1. In addition, the inventive address generator can be adapted in an optimal manner to various functional requirements by the optionally proposed expansions.

Other features which are considered as characteristic for the invention are set forth in the appended claims.

Although the invention is illustrated and described herein as embodied in an address generator for generating addresses for an on-chip trim circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 3 is a circuit diagram containing MOS transistors, illustrating a preferred implementation of a memory stage or register stage of the address generator of the invention;

FIG. 4 is a signal-time diagram for a test operation of a MOS latch circuit according to FIG. 3; and FIG. 5 is a table showing signal states at an output of the memory stage.

DESCRIPTION OF THE PREFERRED EMBODIMENTS

Figure 1:
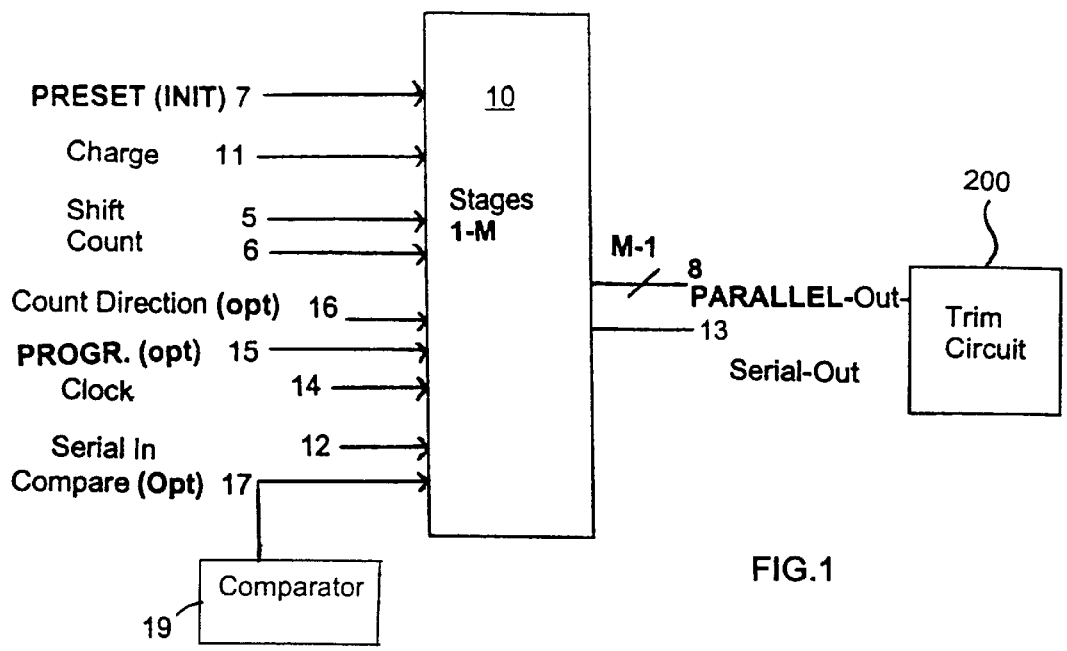
FIG. 1 is a block circuit diagram of an address generator for M bits, with required additional input-output lines, programming lines, and control lines, the lines being provided for an expanded functionality and according to the invention.

In all the figures of the drawing, sub-features and integral parts that correspond to one another bear the same reference symbol in each case. Referring now to the figures of the drawing in detail and first, particularly, to FIG. 1 thereof, there is shown a circuit block diagram of a preferred exemplary embodiment of an inventive address generator 10.

The address generator 10 in FIG. 1 is configured for M bits, and therefore contains M memory or register stages, each made up of a MOS memory latch (see FIG. 3).

Upon an initialization signal supplied to a preset input 7, a parallel charge or fuse information supplied to a parallel input 11 is taken over into a memory latch of the address generator 10, given the presence of a clock signal CLOCK present at a clock input 14.

With a count signal COUNT supplied to an input 6, the address generator 10 is operated in the manner of a counter, and, upon each clock signal at the clock input 14, counts forwards or backwards in agreement with a count direction signal 16. With a signal SHIFT supplied to an input 5, the address generator 10 can be operated as a shift register.

In addition to the above description, it should be mentioned that the address generator 10 contains electrical fuses 105, and the fuse information, present in parallel format at a charge input 11, brings the individual bits of the address generator 10 into the complementary state to the initialization value only given fuses that are respectively intact (or, alternatively, only given fuses that are respectively shot).

The electrical fuses can be polysilicon bridges, gate oxide bridges, tungsten bridges, aluminum bridges, or other metal bridges.

The address generated by the address generator 10 is output to a parallel output 8 that is connected or can be connected with the mentioned trim circuit 200.

In addition, the address generator 10 optionally contains, for testing, a serial input 12 and a serial output 13, with which the counter state or the fuse information of the address generator 10 can be read out in serial fashion. This can take place in a non-destructive fashion through feedback of the serial output 13 to the serial input 12, using feedback elements (not shown in FIG. 1), or can take place in a destructive fashion by giving other (test) information to the serial input.

Moreover, the address generator 10 can be expanded by a programming input 15 that uses information present in the memory latches of the address generator 10 in a bit-by-bit fashion for the programming of the corresponding fuses.

In addition, the address generator 10 can have an additional memory latch 20 into which a signal of a non-illustrated voltage comparator circuit (described in more detail in German Patent Application DE 199 16 244.1 which is hereby incorporated by reference) is supplied through an input 17. The signal can be taken over and can be outputted serially with the address value.

Figure 2:
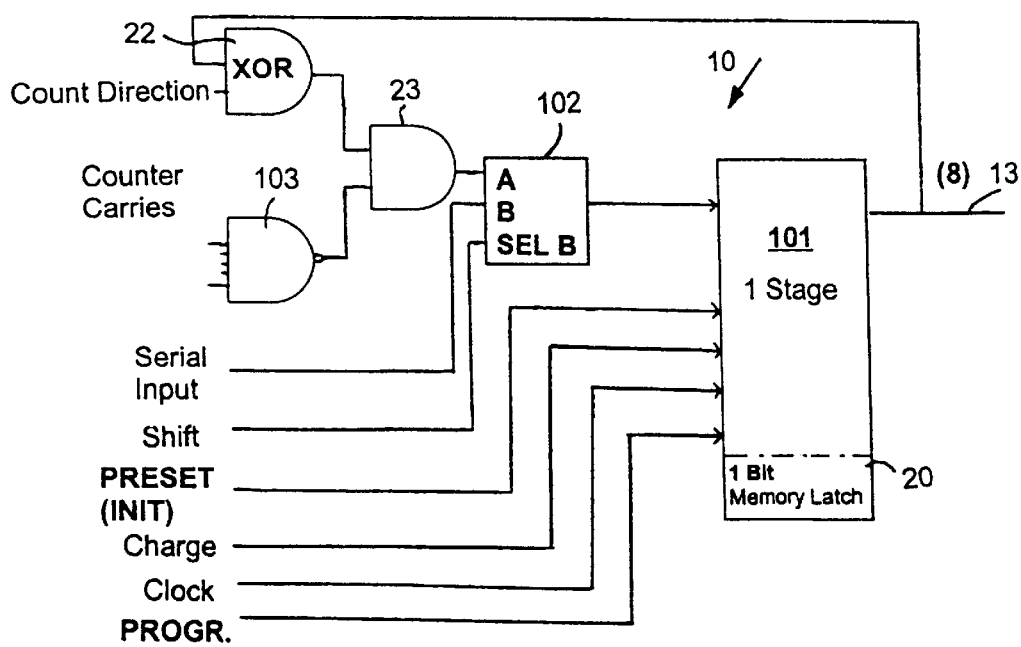
FIG. 2 is a block circuit diagram showing a functionally resolved block switching diagram of a memory/register stage (1 bit) of the address generator shown in FIG. 1.

FIG. 2 shows, in the form of a block diagram, a memory stage 101 of the address generator 10 shown in FIG. 1. Here, the serial and the parallel output coincide.

The carries occurring in the counting process of the address generator 10 are supplied to the memory stage 101 of the address generator 10 through a logical NAND element 103.

Feedback elements 22, 23 are used to feed the information supplied to the serial output 13 back to the serial input. The information fed back from the serial output 13 via the feedback elements 22 and 23, the carries combined in the NAND element 103, and the serial input 12 are combined using a multiplexer 102.

FIG. 3 shows a currently preferred implementation of the memory latch stage 101 according to FIG. 2.

The memory latch stage 101 contains MOS transistors 110, 111, 112, and 113, as well as an inverting element 114. An information input "IN" is connected to an output of multiplexer 102 according to FIG. 2, and is inputted via a transfer gate 115, that is enabled or blocked by the clock signal "CLK, CLK-INV" present at the clock input 14. Likewise, the output information formed by the memory latch stage 101 is supplied to the output via two inverting elements 119, 120 by an additional transfer gate 116, which is likewise enabled or blocked by the clock signal "CLK, CLK-INV." The charge input 11 can be applied to the electrical fuse 105 via a MOS transistor 117.

In FIG. 4, a signal-time diagram is shown for the test operation of the MOS latch circuit shown in FIG. 3, while FIG. 5 shows a truth table of the signal states of the MOS latch circuit shown in FIG. 3, dependent on whether the electrical fuse 105 is shot (blown) or in-tact.

We claim:

1. An address generator for generating addresses for a trim circuit, comprising:

a control input for receiving a control signal;

a clock input for receiving a clock signal; and a number of M stages having memory latches and connected to said clock input and to said control input, upon the control signal being supplied to said control input and upon the clock signal being applied to said clock input said number of M stages able to be operated as one of a synchronous counter and as a shift register, and M being greater than or equal to 1.

2. The address generator according to claim 1, wherein said memory latches have electrical fuses in which a generated address for the trim circuit can be stored permanently given agreement of a trim circuit voltage with a comparison voltage supplied from outside, and said memory latches each contain MOS transistors in a configuration set up for matching a level of address information that is to be supplied to said electrical fuses to a CMOS level.

3. The address generator according to claim 2, wherein said memory latches contain a common initialization input and a charge input such that a signal applied at said charge input brings a respective item of latch information of a respective memory latch into a value complementary to an initialization value only given a respectively intact fuse of said electrical fuses.

4. The address generator according to claim 2, including a serial input and a serial output for reading out a counter state and fuse information in a serial fashion, said serial output connected to said memory latches.

5. The address generator according to claim 4, including feedback elements connected to said serial output and to said serial input for feeding back an output signal from said serial output to said serial input.

6. The address generator according to claim 2, including a programming input connected to said memory latches to program said electrical fuses in a bit-by-bit fashion with information present in said memory latches.

7. The address generator according to claim 5, including a counting direction selection input connected to one of said feedback elements.

8. The address generator according to claim 4, wherein said stages each have an additional memory latch in which a current comparison result of a voltage comparator, which compares the trim circuit voltage currently produced by the trim circuit with the comparison voltage, can be stored and can be outputted at said serial output together with the generated address.

9. The address generator according to claim 2, wherein said memory latches contain a common initialization input and a charge input such that a signal applied at said charge input brings a respective item of latch information of a respective memory latch into a value complementary to an initialization value only if a respectively shot fuse of said electrical fuses is intact.

* * * * *